(12) United States Patent
Dalal et al.

(10) Patent No.: US 8,547,161 B1
(45) Date of Patent: Oct. 1, 2013

(54) TRANSISTOR HAVING ASYMMETRIC GATE-VOLTAGE CONTROL

(75) Inventors: Jinal Dalal, Sunnyvale, CA (US); Srikanth Lakshmikanthan, Milpitas, CA (US); Chris Lyon, Kensington, CA (US); Maire Mahony, San Francisco, CA (US)

(73) Assignee: Google Inc., Mountain View, CA (US)

( * ) Notice: Subject to any disclaimer, the term of this patent is extended or adjusted under 35 U.S.C. 154(b) by 137 days.

(21) Appl. No.: 12/185,334

(22) Filed: Aug. 4, 2008

Related U.S. Application Data

(60) Provisional application No. 61/051,524, filed on May 8, 2008.

(51) Int. Cl.
*H03K 17/04* (2006.01)
*H03K 17/687* (2006.01)
*G05F 1/10* (2006.01)
*G05F 3/02* (2006.01)

(52) U.S. Cl.
USPC ............ 327/434; 327/377; 327/427; 327/541

(58) Field of Classification Search
USPC ................. 327/374, 376, 377, 427, 530, 536; 713/300
See application file for complete search history.

(56) References Cited

U.S. PATENT DOCUMENTS

| | | | | |
|---|---|---|---|---|
| 4,115,740 A * | 9/1978 | Yoshida et al. | ............... | 330/264 |
| 5,608,346 A * | 3/1997 | Giebel | ........... | 327/382 |
| 6,483,369 B1 * | 11/2002 | Wittenbreder, Jr. | ........... | 327/427 |
| 6,633,195 B2 * | 10/2003 | Baudelot et al. | ............... | 327/430 |
| 6,778,001 B2 * | 8/2004 | Mayama et al. | ............... | 327/427 |
| 6,967,520 B2 * | 11/2005 | Takehara | ....................... | 327/427 |
| 7,659,754 B2 * | 2/2010 | Thiele et al. | ................... | 327/108 |
| 7,805,623 B2 * | 9/2010 | Jia et al. | ....................... | 713/300 |
| 2007/0245165 A1 * | 10/2007 | Fung | .............................. | 713/320 |
| 2008/0126814 A1 * | 5/2008 | Burkland et al. | ............. | 713/300 |

* cited by examiner

*Primary Examiner* — Lincoln Donovan
*Assistant Examiner* — Colleen O Toole
(74) *Attorney, Agent, or Firm* — Foley and Lardner LLP; John D. Lanza

(57) ABSTRACT

Embodiments of a circuit, which includes a device and a switch, which is electrically coupled to the device, to control power applied to the device, are described. This switch includes a control terminal, which controls the switch, and two other terminals, which can receive power to be applied to the device. Moreover, the circuit is configured to apply a voltage to the control terminal to ensure the switch remains open when a supply voltage is applied to one of the two other terminals while powering-up the circuit, thereby preventing spurious application of the supply voltage to the device.

18 Claims, 4 Drawing Sheets

TRANSISTOR HAVING ASYMMETRIC GATE-VOLTAGE CONTROL

RELATED APPLICATIONS

This application claims priority under 35 U.S.C. section 119(e) to U.S. Provisional Application Ser. No. 61/051,524, entitled "Fast FET Turn-Off Circuit," by Jinal Dalal, Srikanth Lakshmikanthan, Chris Lyon, and Maire Mahony filed on 8 May 2008, the contents of which are herein incorporated by reference.

BACKGROUND

1. Field

The present embodiments relate to power-management circuits.

2. Related Art

Data centers typically contain a large number of devices, such as data-storage devices and servers, which routinely change power state. For example, a given device may be selectively powered-up or powered-down (i.e., power, such as a supply voltage, may be applied to or disconnected from the given device) and/or selectively turned-on or turned-off (i.e., activated or deactivated). These changes in power state typically take place, for example, when: devices are changed, the data center is reconfigured, and/or for purposes of power management in the data center.

In a typical data center, power-management circuits are used to control the power applied to a given device, as well as to turn the given device on or off. Ensuring that the given device does not spuriously turn-on when the associated power-management circuit is powered-up can be difficult.

Many existing power-management circuits include a slow turn-on circuit to limit the current that flows through the power-management circuit to the given device when the given device is turned-on. These power-management circuits can cause spurious turn-on of the given device when the power-management circuits are powered-up. This is because a slow turn-on circuit often has a slow turn-off due to the RC characteristics of this circuit. Consequently, when the supply voltage is applied to the power-management circuit, the slow turn-on circuit may not stay in an 'off' state and a transient signal may be inadvertently applied to the given device. This inadvertent transient signal can cause out-of-order power sequencing, as well as to a hardware latch or failure.

SUMMARY

One embodiment provides a circuit that includes a device and a switch, which is electrically coupled to the device, to control power applied to the device. This switch includes a control terminal, which controls the switch, and two other terminals, which can receive power to be applied to the device. The circuit is configured to apply a voltage to the control terminal to ensure the switch remains open when a supply voltage is applied to one of the two other terminals while powering-up the circuit, thereby preventing spurious application of the supply voltage to the device.

In some embodiments, the device includes: a data-storage device (such as a hard disk drive) and/or a server. Moreover, the circuit may be included in a data center.

In some embodiments, the switch includes a field-effect transistor (FET), and the control terminal is a gate of the FET. For example, the FET may be n-type or p-type. Moreover, the FET may include a metal-oxide-semiconductor FET (MOSFET).

In some embodiments, the circuit includes an input node, which is electrically coupled to the gate, to receive a control signal, where the control signal sets a state of the switch. Moreover, the supply voltage is applied to the device when the switch is closed.

In some embodiments, the circuit includes a diode, which is electrically coupled to the input node and the gate, and an impedance, which is electrically coupled to the input node and the gate, and which is in parallel with the diode. This diode provides a lower-impedance path between the input node and the gate than the impedance when the supply voltage is applied to one of the two other terminals, thereby ensuring that the switch remains open when the supply voltage is applied to the circuit.

Moreover, the impedance may control a current that flows through the switch to the device when the switch is closed. For example, the impedance may include a resistor.

In some embodiments, the one of the two terminals is the source, and a remaining one of the two terminals is a drain, which is electrically coupled to the device.

In some embodiments, a capacitance of the FET between the gate and the drain is used to control a current that flows through the switch to the device when the switch is closed.

Moreover, the circuit may include: a capacitor which is electrically coupled to the drain and to a ground and/or another capacitor which is electrically coupled to the gate and to the drain.

In some embodiments, the circuit includes control logic to apply the voltage to the control terminal prior to applying the supply voltage to the one of the other terminals to ensure the switch remains open.

Another embodiment provides a data center that includes multiple instances of the circuit.

Another embodiment provides a method for powering-up the circuit. During this method, a voltage is applied to the control terminal of the switch in the circuit to ensure that the switch remains open while the circuit is powered-up, where the switch is electrically coupled to the device. Then, after the voltage has been applied to the control terminal, a source voltage is applied to one of two other terminals of the switch which can receive power to be applied to the device, thereby preventing spurious application of the supply voltage to the device when the circuit is powered-up.

BRIEF DESCRIPTION OF THE FIGURES

Note that like reference numerals refer to corresponding parts throughout the drawings.

DETAILED DESCRIPTION

Figure 1A:
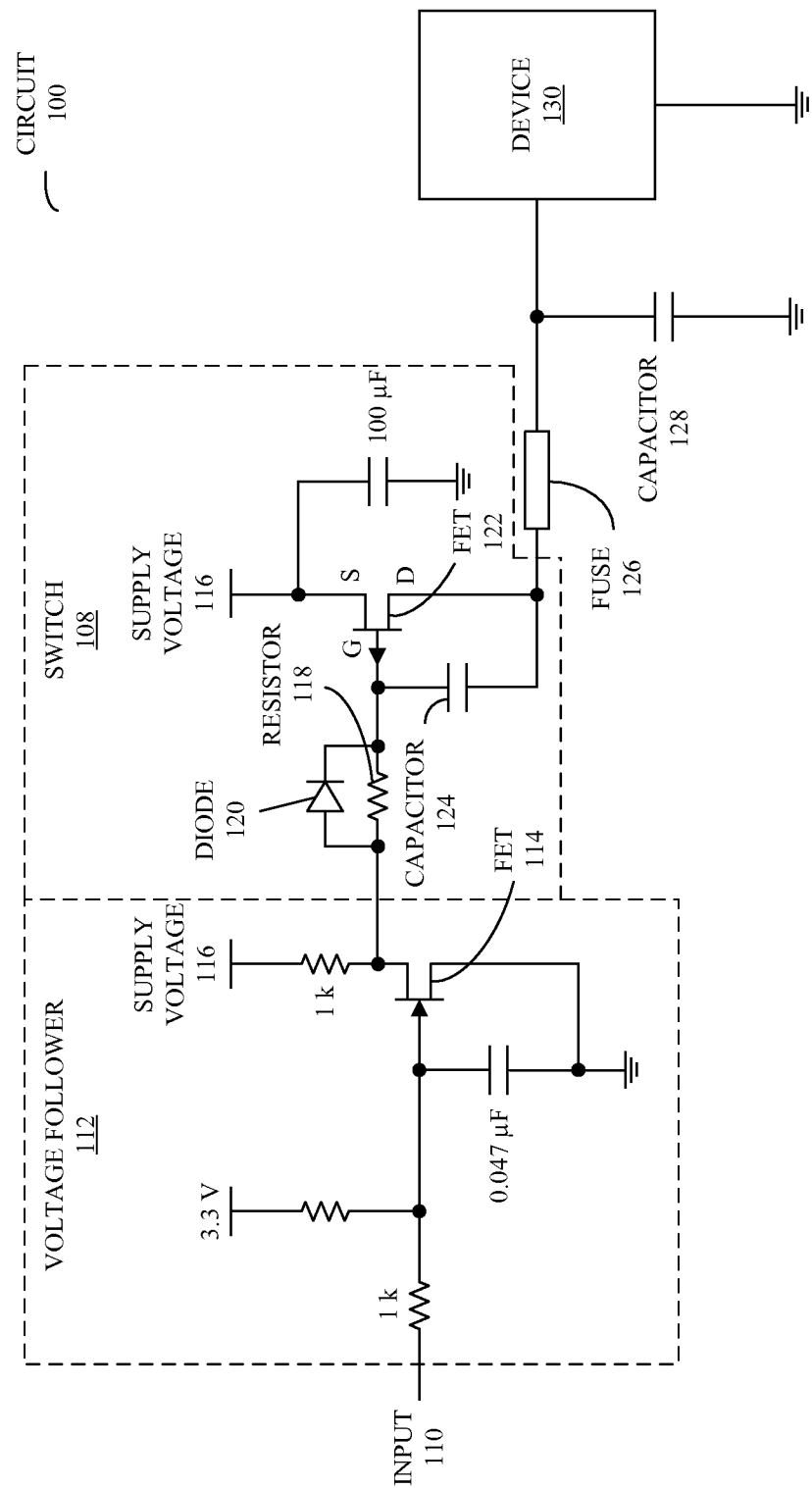
FIG. 1A is a block diagram illustrating an embodiment of a circuit.

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present disclosure is not intended to be limited to the embodiments shown, but is to be accorded the widest scope consistent with the principles and features disclosed herein.

Embodiments of a circuit, a data center that includes multiple instances of the circuit, and a technique for powering-up the circuit are described. This circuit includes a switch (which includes a control terminal and two other terminals) that controls power applied to a device, such as: a hard disk drive, a data-storage device, and/or a server. Moreover, the circuit is configured to apply a signal (such as a voltage) to the control terminal to ensure that the switch remains open when power (such as a supply voltage) is applied to one of the other terminals when powering-up the circuit, thereby preventing inadvertent application of the power to the device, i.e., spurious turn-on of the device.

In some embodiments, the switch includes a field-effect transistor (FET), and the control terminal is a gate of the FET. The circuit may also include an input node, which is electrically coupled to the gate, to receive a control signal that sets a state of the switch. Moreover, a diode and an impedance (such as a resistor), which is in parallel with the diode, may be electrically coupled to the gate. When the circuit is powered-up, this diode may provide a lower-impedance path between the input node and the gate than the impedance when the supply voltage is applied to one of the two other terminals of the FET, thereby ensuring that the switch remains open when the supply voltage is applied to the circuit. Note that the impedance may control a current (which is sometimes referred to as an 'in-rush' current) that flows through the switch to the device when the switch is closed, in particular, after the circuit is powered-up, when the supply voltage is applied to the device based on the control signal (i.e., when the device is turned-on).

Additionally, properties of the FET may be used to control the in-rush current that flows through the switch to the device when the switch is closed. For example, the FET may be n-type, and the source may be selectively electrically coupled to the supply voltage and the drain may be electrically coupled to the device. In this configuration, a capacitance of the FET between the gate and the drain (such as the capacitance associated with the Miller effect) controls the in-rush current. Note that in this configuration the switch intentionally closes slowly. However, the use of the diode ensures that it remains turned-off when the circuit is powered-up.

More generally, the circuit may avoid spurious turn-on of the device using control logic. For example, the control logic may apply the voltage to the control terminal prior to applying the supply voltage to the one of the other terminals to ensure the switch remains open.

We now describe embodiments of a power-management circuit. FIG. 1A presents a block diagram illustrating an embodiment of a circuit 100. In this circuit, a switch 108 is used to turn-on and turn-off device 130 (such as a data-storage device and/or a server) by applying power to this device in a controlled way. In particular, the switch 108 (which includes a control terminal that is used to set the state of switch 108, as well as two other terminals) is configured to prevent spurious turn-on of the device 130 when circuit 100 is powered-on, for example, when supply voltage 116 is applied to one of the two other terminals of the switch 108. Additionally, when the switch 108 is closed (for example, based on a control signal, which is received on input 110, and which is applied to the control terminal), the switch 108 is configured to limit the in-rush current that flows through the switch 108, thereby preventing fuse 126 from tripping or, more generally, from exceeding a power-protection threshold of this fuse.

In some embodiments, switch 108 includes a field-effect transistor (FET) 122, such as a metal-oxide-semiconductor FET (MOSFET), and input 110 may be electrically coupled to the gate (G) of FET 122, which is the control terminal of switch 108. Note that input 110 may be electrically coupled to this gate by a voltage follower 112, which may include a FET 114. This voltage follower may provide impedance-isolation of input 110 and switch 108.

Moreover, switch 108 may include diode 120 and resistor 118 (or, more generally, an impedance), which are both coupled to the gate and which are in parallel with each other. Diode 120 may apply a voltage to the gate when the circuit 100 is powered-up, i.e., when supply voltage 116 is applied to the source (S) of FET 122, to ensure that the FET 122 remains open, thereby preventing spurious application of the supply voltage 116 to the device 130 via the drain (D) of FET 122. In particular, diode 120 may provide a lower-impedance path between input 110 and the gate than resistor 118 when the supply voltage 116 is applied to the source, which reduces the time needed for the gate to charge-up and, therefore, keeps FET 122 open.

When the control signal on input 110 is pulled low, the output from voltage follower 112 is pulled low. Consequently, diode 120 is reversed biased, the gate is at a lower potential than the source so FET 122 will 'close' (there will be a low-impedance path between the source and the drain), and an in-rush current will flow through switch 108 and capacitor 124 to device 130. This current may be, in part, controlled (or limited) by the resistance of resistor 118. Additionally, as noted previously, a capacitance of the FET between the gate and the drain of FET 122 (such as the capacitance associated with the Miller effect) may also control (or limit) the in-rush current that flows to the device 130 when the switch 108 is closed. Note, therefore, that circuit 110 provides a fast 'turn-off' (or 'opening') and a slow 'turn-on' (or 'closing') of FET 122. This asymmetric switching time is useful in applications such as data centers, which are described further below with reference to FIG. 2.

In some embodiments, circuit 100 includes capacitor 128, which is electrically coupled to the drain (via fuse 126) and to ground.

Figure 1B:
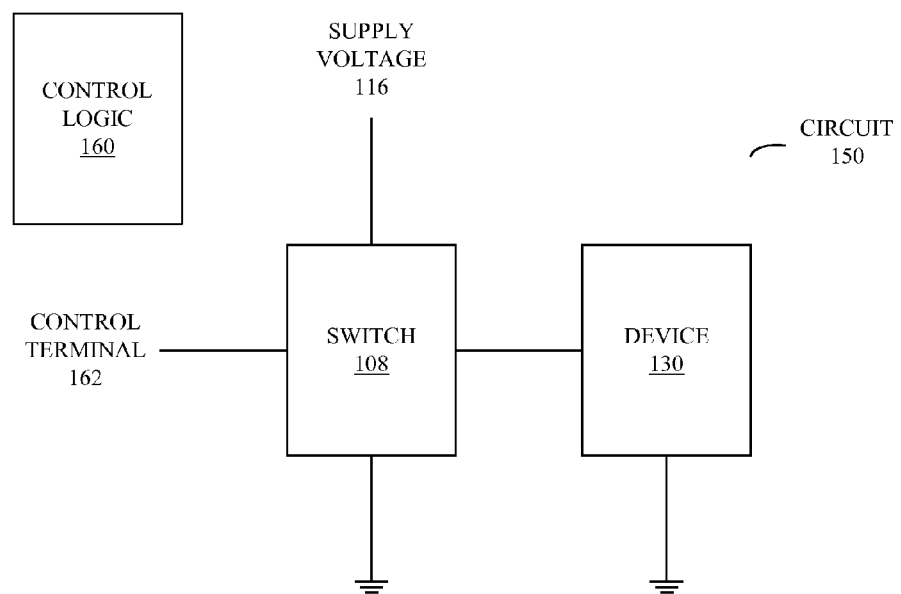
FIG. 1B is a block diagram illustrating an embodiment of a circuit.

In an alternate embodiment, control logic may be used to ensure that the switch 108 remains open when the circuit is powered-up. This is shown in FIG. 1B, which presents a block diagram illustrating an embodiment of a circuit 150. In particular, when supply voltage 116 is applied to switch 108, control logic 160 applies a voltage to control terminal 162 to ensure that switch 108 remains open, and thus, to prevent spurious turn-on of device 130.

Referring back to FIG. 1A, in an exemplary embodiment, supply voltage 116 is 12 V, resistor 118 is 100 kΩ, capacitor 124 is 0.047 µF, and capacitor 128 is 330 µF. When circuit 100 is powered-on, 12V supply voltage 116 is applied to the source of FET 122, and a voltage approximately one-forward-diode-drop less (which is greater than the threshold voltage of FET 122) is applied to the gate of FET 122 via diode 120. This gate charges-up rapidly, which prevents FET 122 from closing prematurely during power-up of circuit 100.

When input 110 is pulled low, the voltage on the gate falls below the threshold of FET 122, which closes FET 122, and thus, switch 108.

Figure 2:
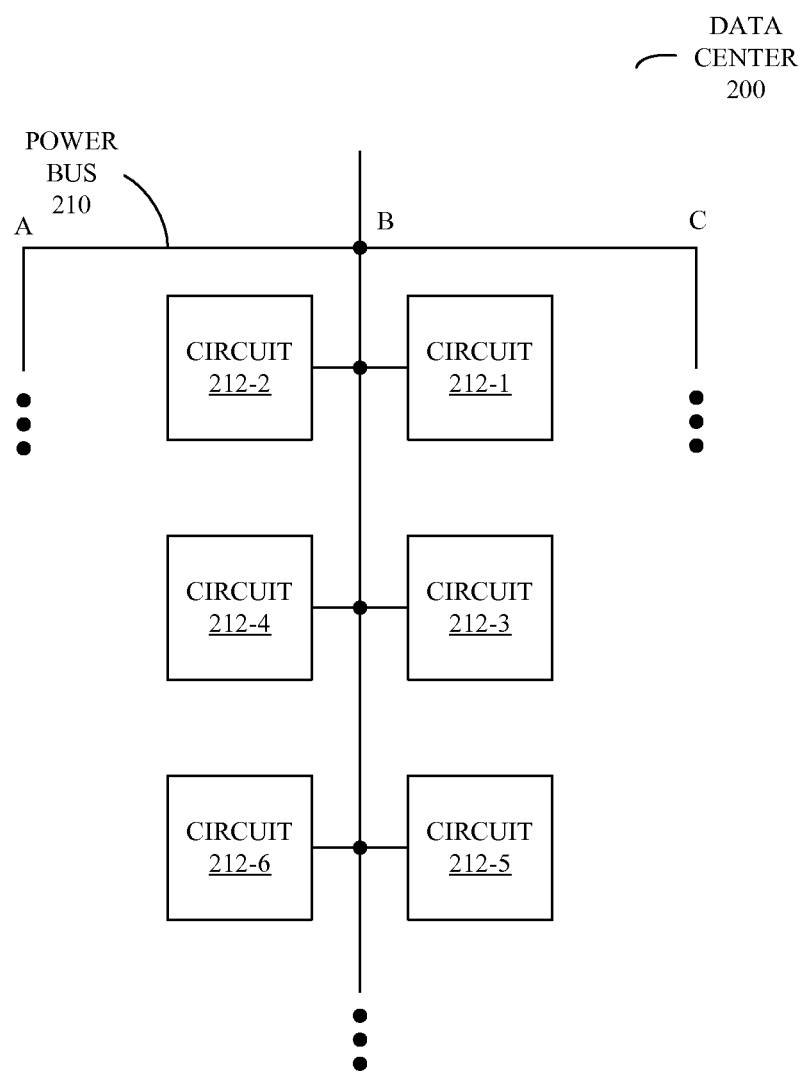
FIG. 2 is a block diagram illustrating an embodiment of a data center.

As noted previously, FET 122 closes slowly and the in-rush current is spread out over time. However, in power-management applications, such as data centers, switching speed and switching losses may not be important design considerations. FIG. 2 presents a block diagram illustrating an embodiment of a data center 200. This data center may include multiple instances of circuit 100 (FIG. 1A) and/or 150 (FIG. 1B), such as circuits 212, which are electrically coupled to a power bus 210. Circuits 212 may be used to selectively control the power applied to devices, such as device 130 (FIGS. 1A and 1B).

The asymmetric switching behavior of the switches in circuits 212 may be useful in applications, such as data center 200. In particular, this switching behavior may allow circuits 212 to be powered-up without spurious turn-on of devices in these circuits. Moreover, when these devices are turned-on, the in-rush current may be spread out over time. In these applications, such a slow turn-on may be useful because this may allow a tighter power-protection threshold to be set. For example, referring back to FIG. 1A, if supply voltage 116 is 12 V, capacitor 128 is 330 µf, and the switching time of FET 122 is 20 ns, the in-rush current is 198,000 A, which would greatly exceed the power-protection threshold of fuse 126. However, resistor 118, capacitor 124 and the capacitance between the gate and drain of FET 122 can sufficiently slow down the switching time (i.e., can reduce dV/dt) that the peak transient in-rush current remains five or more orders of magnitude smaller (and well below the power-protection threshold of fuse 126).

In some embodiments, circuit 100, circuit 150 (FIG. 1B) and/or data center 200 (FIG. 2) include fewer or additional components. Moreover, two or more components may be combined into a single component and/or a position of one or more components may be changed. For example, control logic 160 (FIG. 1B) may be included in a hot-swap controller. Moreover, fuse 126 (FIG. 1A) may be: a destructive fuse, a resettable fuse, and/or a programmable fuse.

Components and/or functionality illustrated in these embodiments may be implemented using analog circuits and/or digital circuits. Moreover, circuits may include bipolar transistors and/or FETs, and these components may use p-type and/or n-type. Furthermore, components and/or functionality in circuit 100, circuit 150 (FIG. 1B) and/or data center 200 (FIG. 2) may be implemented using hardware and/or software.

Figure 3:
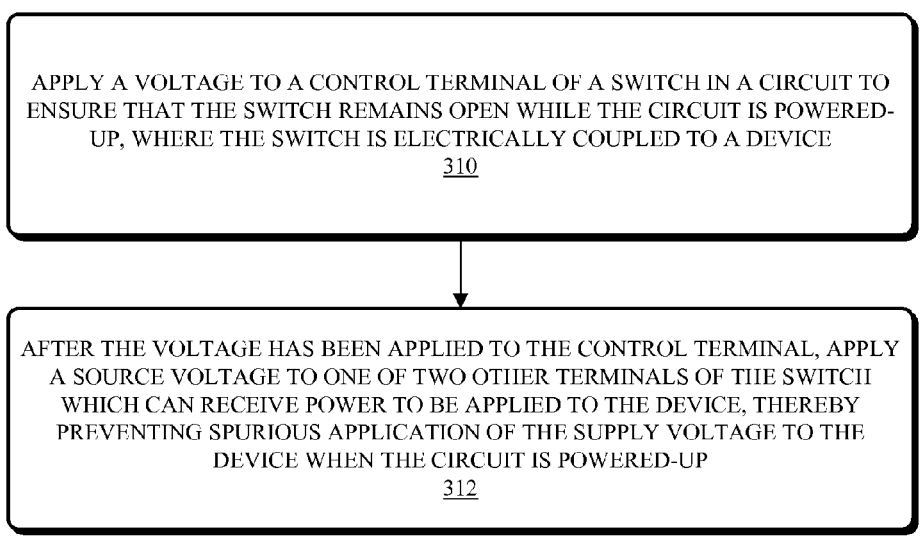
FIG. 3 is a flowchart illustrating an embodiment of a process for powering-up a circuit.

We now describe embodiments of a process for powering-up a circuit. FIG. 3 presents a flowchart illustrating an embodiment of a process 300 for powering-up a circuit. During this method, a voltage is applied to the control terminal of the switch in the circuit to ensure that the switch remains open while the circuit is powered-up (310), where the switch is electrically coupled to the device. Then, after the voltage has been applied to the control terminal, a source voltage is applied to one of two other terminals of the switch which can receive power to be applied to the device (312), thereby preventing spurious application of the supply voltage to the device when the circuit is powered-up.

In some embodiments, process 300 includes additional or fewer operations. Moreover, the order of the operations may be changed and/or two or more operations may be combined into a single operation.

While the preceding embodiments have used a data center as an illustration, these power-management techniques may be used in a wide variety of electronic devices and systems, such as: a personal computer, a laptop computer, a server computer, a work station, a mainframe computer, or another computing device or system capable of manipulating computer-readable data. Moreover, the system may be at a single location or may be a distributed system, such as one in which two or more computing devices communicate information with each over a network (such as the Internet and/or an intranet).

The foregoing descriptions of embodiments have been presented for purposes of illustration and description only. They are not intended to be exhaustive or to limit the present embodiments to the forms disclosed. Accordingly, many modifications and variations will be apparent to practitioners skilled in the art. Additionally, the above disclosure is not intended to limit the present embodiments. The scope of the present embodiments are defined by the appended claims.

What is claimed is:

1. A circuit, comprising:
   a device comprising a computer server in a computer data center;
   a switch, electrically coupled to the device, to control power applied to the device, the switch including a control terminal and two other terminals;
   a diode electrically coupled to an input node of the circuit and to the control terminal of the switch;
   an impedance electrically coupled to the input node of the circuit and to the control terminal of the switch, wherein the impedance is parallel to the diode;
   a capacitor separate from the switch that is electrically coupled between the control terminal of the switch and a first of the two other terminals;
   a voltage follower circuit electrically coupled between the input node and the diode; and
   a control circuit comprising a hot swap controller configured to provide a control signal to the input node prior to applying a supply voltage, wherein when the supply voltage is applied to a second of the two other terminals of the switch, the diode applies a voltage to the control terminal of the switch which causes the switch to remain open while the circuit is powering-up, whereby the supply voltage is applied to the second of the two other terminals of the switch after the control signal has been applied to the control terminal, thereby preventing spurious application of the supply voltage to the device.

2. The circuit of claim 1, wherein the device includes a data-storage device.

3. The circuit of claim 1, wherein the device includes a hard disk drive.

4. The circuit of claim 1, wherein the switch includes a field-effect transistor (FET); and
   wherein the control terminal is a gate of the FET.

5. The circuit of claim 4, wherein the FET is n-type.

6. The circuit of claim 4, wherein the FET is p-type.

7. The circuit of claim 4, wherein the FET includes a metal-oxide-semiconductor FET (MOSFET).

8. The circuit of claim 4, further comprising an wherein the input node is electrically coupled to the gate, to receive the first a control signal, wherein the first control signal sets a state of the switch; and
   wherein the supply voltage is applied to the device when the switch is closed.

9. The circuit of claim 8, wherein the diode provides a lower-impedance path between the input node and the gate than the impedance when the supply voltage is applied to the second of the two other terminals of the switch, thereby ensuring that the switch remains open when the supply voltage is applied to the circuit.

10. The circuit of claim 9, wherein the impedance controls a current that flows through the switch to the device when the switch is closed.

11. The circuit claim of 9, wherein the impedance includes a resistor.

12. The circuit of claim 8, wherein the first of the two other terminals is a drain, which is electrically coupled to the device; and
   wherein the second of the two other terminals is the source.

13. The circuit of claim 12, wherein a capacitance of the FET between the gate and the drain is used to control a current that flows through the switch to the device when the switch is closed.

14. The circuit of claim 12, further comprising a capacitor electrically coupled to the drain and to a ground.

15. A computer data center, comprising multiple instances of a circuit, wherein the circuit includes:
  a device comprising a server computer coupled to other server computers in the computer data center;
  a switch, electrically coupled to the device, to control power applied to the device, the switch including a control terminal and two other terminals;
  a diode electrically coupled to an input node of the circuit and to the control terminal of the switch;
  an impedance electrically coupled to the input node of the circuit and to the control terminal of the switch, wherein the impedance is parallel to the diode;
  a capacitor separate from the switch that is electrically coupled between the control terminal of the switch and a first of the two other terminals;
  a voltage follower circuit electrically coupled between the input node and the diode; and
  a control circuit comprising a hot swap controller configured to provide a control signal to the input node prior to applying a supply voltage, wherein when the supply voltage is applied to a second of the two other terminals of the switch, the diode applies a voltage to the control terminal of the switch which causes the switch to remain open while the circuit is powering-up, whereby the supply voltage is applied to the second of the two other terminals of the switch after the first control signal has been applied to the control terminal, thereby preventing spurious application of the supply voltage to the device.

16. A method for powering-up a circuit at a computer data center, comprising:
  applying a voltage to an input node of a voltage follower circuit using a hot swap controller, the voltage follower circuit to apply a voltage to an anode terminal of a diode coupled to a control terminal of a switch in the circuit to ensure that the switch remains open while the circuit is powered-up, wherein an impedance in the circuit is parallel to the diode, wherein a capacitor separate from the switch is electrically coupled between the control terminal of the switch and a first of two other terminals of the switch, and wherein the switch is electrically coupled to a server computer coupled to other server computers in the computer data center; and
  after the voltage has been applied to the control terminal, applying a source voltage to a second of the two other terminals of the switch configured to receive power to be applied to the server computer, thereby preventing spurious application of the supply voltage to the server computer when the circuit is powered-up.

17. The circuit of claim 1, wherein the voltage follower circuit comprises a transistor, wherein the voltage follower circuit is configured to provide impedance-isolation of the input node and the switch.

18. The circuit of claim 1, wherein the hot swap controller comprises a tangible medium programmed with software configured to provide the control signal.

* * * * *